(12) United States Patent
Watatani et al.

(10) Patent No.: US 12,308,607 B2
(45) Date of Patent: May 20, 2025

(54) SEMICONDUCTOR LASER ELEMENT, METHOD FOR MANUFACTURING SAME, AND SEMICONDUCTOR LASER DEVICE

(71) Applicant: Mitsubishi Electric Corporation, Tokyo (JP)

(72) Inventors: Chikara Watatani, Tokyo (JP); Motoharu Miyashita, Tokyo (JP); Takehiro Nishida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 607 days.

(21) Appl. No.: 17/641,164

(22) PCT Filed: Dec. 4, 2019

(86) PCT No.: PCT/JP2019/047331
§ 371 (c)(1),
(2) Date: Mar. 8, 2022

(87) PCT Pub. No.: WO2021/111536
PCT Pub. Date: Jun. 10, 2021

(65) Prior Publication Data
US 2022/0344893 A1    Oct. 27, 2022

(51) Int. Cl.
*H01S 3/00* (2006.01)
*H01S 5/0234* (2021.01)
(Continued)

(52) U.S. Cl.
CPC .......... *H01S 5/0237* (2021.01); *H01S 5/0234* (2021.01); *H01S 5/0425* (2013.01);
(Continued)

(58) Field of Classification Search
CPC .... H01S 5/0237; H01S 5/0234; H01S 5/0425; H01S 5/04254; H01S 5/22; H01S 5/2205; H01S 5/4031; H01S 2301/17
See application file for complete search history.

(56) References Cited

U.S. PATENT DOCUMENTS 5,316,967 A * 5/1994 Kaneno ............. H01L 21/02395
438/494
2004/0252739 A1* 12/2004 Takeuchi .................. H01S 5/22
372/46.01
(Continued)

FOREIGN PATENT DOCUMENTS

JP    2007-103804 A    4/2007
JP    2009-141094 A    6/2009
(Continued)

OTHER PUBLICATIONS

International Search Report issued in PCT/JP2019/047331; mailed Feb. 25, 2020.

*Primary Examiner* — Kinam Park
(74) *Attorney, Agent, or Firm* — Studebaker Brackett PLLC

(57) ABSTRACT

Provided here are: semiconductor layers comprised of an n-type cladding layer formed on a surface of an n-type GaAs substrate, active layers formed on surfaces of the n-type cladding layer, p-type cladding layers formed on surfaces of the active layers, and p-type contact layers formed on surfaces of the p-type cladding layers, the p-type cladding layers and the p-type contact layers being formed to have a ridges; insulating films covering surfaces of the semiconductor layers but having openings on surfaces of the p-type contact layer; and conductive layers connected to the p-type contact layers through the openings, the conductive layers being formed on surfaces of the insulating films to cover planar portions provided in the semiconductor layers adja- (Continued)

cently to the ridges; wherein, together with the conductive layers, convex sidewalls are provided to be placed over portions of the planar portions at their sides nearer to the ridges.

15 Claims, 11 Drawing Sheets

(51) Int. Cl.
*H01S 5/0237* (2021.01)
*H01S 5/042* (2006.01)
*H01S 5/22* (2006.01)
*H01S 5/40* (2006.01)

(52) U.S. Cl.
CPC ............ *H01S 5/04254* (2019.08); *H01S 5/22* (2013.01); *H01S 5/2205* (2013.01); *H01S 5/4031* (2013.01); *H01S 2301/176* (2013.01)

(56) References Cited

U.S. PATENT DOCUMENTS

| | | | |
|---|---|---|---|
| 2008/0291960 A1* | 11/2008 | Inoue | ................... H01S 5/02375 372/45.01 |
| 2009/0147816 A1* | 6/2009 | Iga | ........................... H01S 5/22 372/50.12 |
| 2010/0254421 A1 | 10/2010 | Iga et al. | |
| 2011/0013655 A1* | 1/2011 | Takase | ................... H01S 5/0237 372/45.01 |
| 2011/0249694 A1 | 10/2011 | Nishiguchi et al. | |

FOREIGN PATENT DOCUMENTS

| | | |
|---|---|---|
| JP | 2010-245207 A | 10/2010 |
| JP | 2011-192742 A | 9/2011 |
| JP | 2011-222675 A | 11/2011 |
| JP | 2016-082050 A | 5/2016 |
| JP | 2019-004064 A | 1/2019 |

\* cited by examiner

SEMICONDUCTOR LASER ELEMENT, METHOD FOR MANUFACTURING SAME, AND SEMICONDUCTOR LASER DEVICE

TECHNICAL FIELD

The present application relates to a semiconductor laser element, a method for manufacturing the same, and a semiconductor laser device.

BACKGROUND ART

Semiconductor laser elements are each mounted on a sub-mount through a solder in a junction-up or junction-down manner. When it is intended to improve its characteristics during high-power and high-temperature operation, junction-down mounting is generally employed to thereby achieve ensuring heat-dissipation capability.

When the semiconductor laser element is of a multi-emitter type having multiple light-emitting spots, it is difficult in terms of achieving increased power, enhanced performance and cost reduction, to enlarge the size (width) of the semiconductor laser element in proportion to the increased number of the light-emitting spots. Thus, according to the multi-emitter type semiconductor laser element, an interval between light-emitting spots becomes narrower as the number of the light-emitting spots increases, so that a problem arises in that, when the semiconductor laser element is mounted on the sub-mount in a junction-down manner, a solder flowing out at the time of bonding to the sub-mount, is likely to make contact with an adjacent light-emitting spot or electrode.

In this regard, for example in Patent Document 1, such a technique is disclosed in which an electrically-conductive layer is provided between a surface of the semiconductor laser element and the sub-mount to thereby establish a clearance, and a concave portion is formed in the electrically-conductive layer to thereby create a space for storing a solder layer formed on the surface of a sub-mount electrode, so that the solder is prevented from flowing out at the time of mounting on the sub-mount.

CITATION LIST

Patent Document

Patent Document 1: Japanese Patent Application Laid-open No. 2019-4064 (Paragraph 0024; FIG. 2)

SUMMARY OF THE INVENTION

Problems to be Solved by the Invention

According to the semiconductor laser element described in Patent Document 1, however, after the formation of the electrically-conductive layer, it is necessary to subject it to a shaping process to thereby form the concave portion. Thus, there is a problem that the manufacturing cost will increase further.

This application discloses a technique for solving the problem as described above, and an object thereof is to provide a semiconductor laser element, a method for manufacturing the same and a semiconductor laser device, by which electrical short-circuiting is prevented from occurring due to flowing out of the solder at the time of bonding to the sub-mount, and reduction in the manufacturing cost is achieved.

Means for Solving the Problems

A semiconductor laser element disclosed in this application is characterized by comprising:
semiconductor layers which are comprised of a first cladding layer formed on a surface of a semiconductor substrate; an active layer formed on a surface of the first cladding layer; a second cladding layer formed on a surface of the active layer; and a contact layer formed on a surface of the second cladding layer; said second cladding layer and said contact layer being formed to have a ridge portion;
an insulating film which covers a surface of the semiconductor layers but has an opening on a surface of the contact layer; and
an electrically-conductive layer which is connected to the contact layer through the opening, said electrically-conductive layer being formed on a surface of the insulating film so as to cover a planar portion which is provided in the semiconductor layers adjacently to the ridge portion;
wherein, together with the electrically-conductive layer, a sidewall is provided to be placed over a portion of the planar portion at its side nearer to the ridge portion.

A manufacturing method of a semiconductor laser element disclosed in this application is characterized by comprising;
a step of forming an insulating film covering a surface of semiconductor layers which are comprised of a first cladding layer formed on a surface of a semi-conductor substrate; an active layer formed on a surface of the first cladding layer; a second cladding layer formed on a surface of the active layer; and a contact layer formed on a surface of the second cladding layer; said second cladding layer and said contact layer being formed to have a ridge portion, and said insulating film having an opening on a surface of the contact layer;
a step of forming an underlying electrode separately as a first underlying electrode and a second underlying electrode, respectively, on a surface of the insulating film and on surfaces of the contact layer and the insulating film; said first underlying electrode having a patterned shape corresponding to a sidewall which is to be provided over a planar portion provided in the semiconductor layers adjacently to the ridge portion, and at a position nearer to the ridge portion; and said second underlying electrode being connected to the contact layer through the opening, surrounding the first underlying electrode, and covering a surface of the insulating film under which the planar portion is covered; and
a step of plating the first underlying electrode and the second underlying electrode in such a manner that a current value of a current fed to the first underlying electrode is set larger than a current value of a current fed to the second underlying electrode.

Effect of the Invention

According to the present application, since the sidewall can retain the spreading of the solder within the vicinity of a non-light emitting region, it is possible to prevent an inter-element electrical short circuit. In addition, since it can be formed easily, it is possible to reduce the manufacturing cost.

MODES FOR CARRYING OUT THE INVENTION

Embodiment 1

Figure 1:
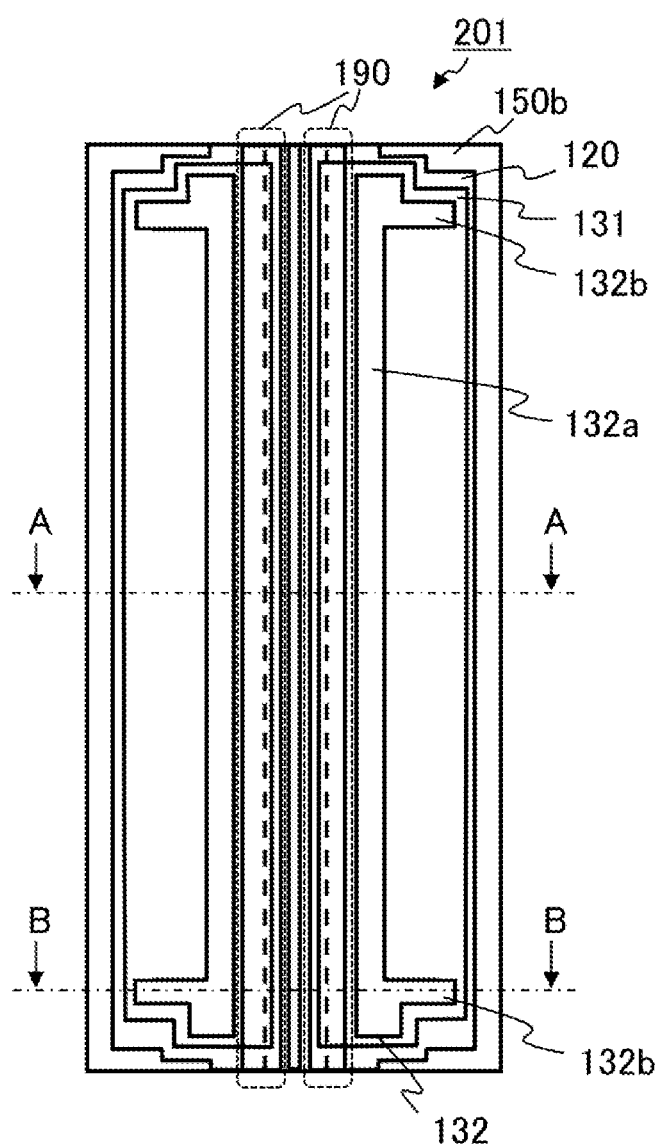
FIG. 1 is a plan view showing a configuration of a semiconductor laser element according to Embodiment 1, viewed from its side to be bonded.
Figure 2:
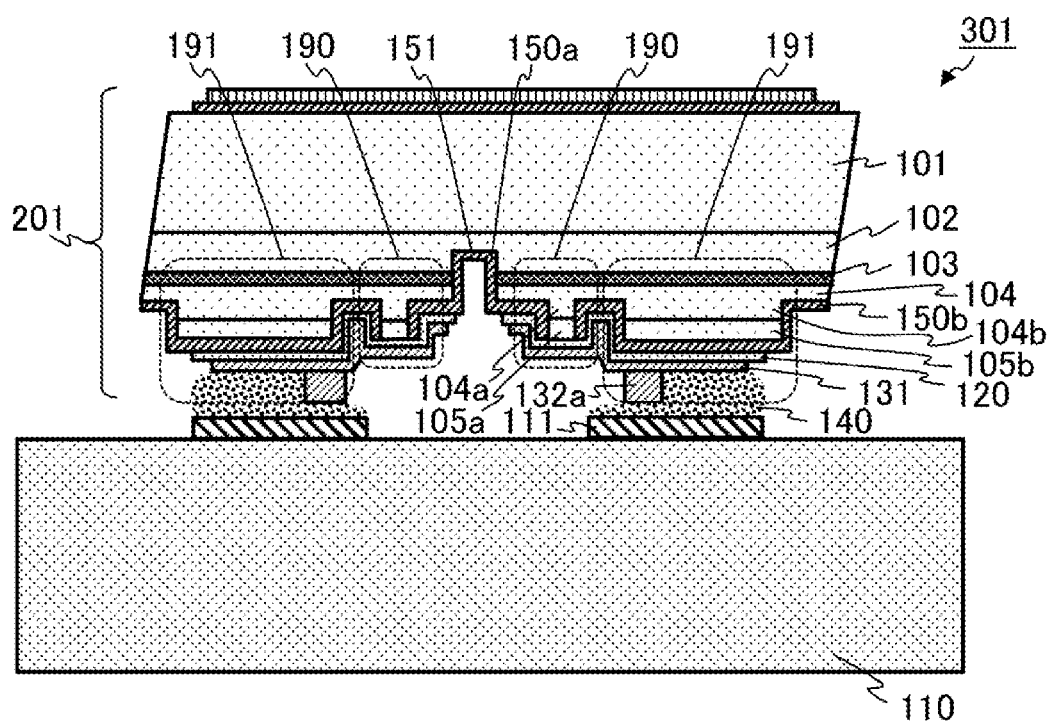
FIG. 2 is a sectional view showing a configuration of the semiconductor laser element according to Embodiment 1.
Figure 3:
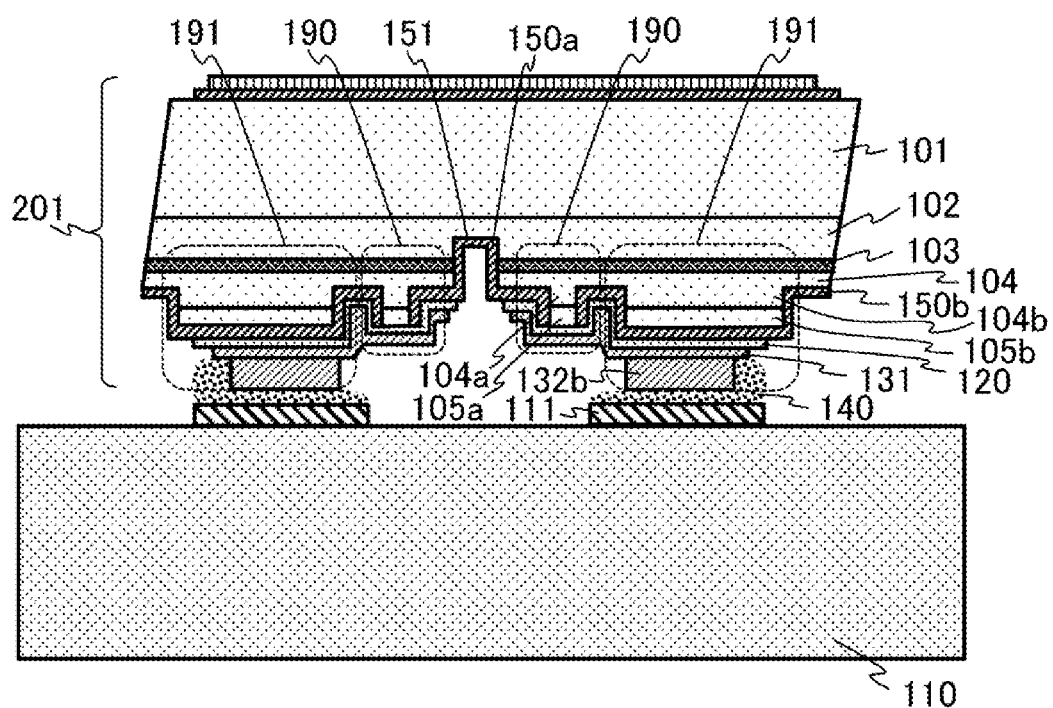
FIG. 3 is a sectional view showing a configuration of the semiconductor laser element according to Embodiment 1.

FIG. 1 is a plan view showing a configuration of a semiconductor laser element 201 according to Embodiment 1, viewed from its side to be bonded. FIG. 2 is an A-A arrow sectional view in FIG. 1, and FIG. 3 is a B-B arrow sectional view in FIG. 1, both of which show a state after mounting. As shown in FIG. 1 to FIG. 3, the semiconductor laser element 201 includes semiconductor layers which are comprised of: an n-type GaAs substrate 101; an n-type cladding layer 102 as a first cladding layer; an active layer 103; a p-type cladding layer 104 as a second cladding layer; and a p-type contact layer 105 (105a, 105b). On a major surface of the n-type GaAs substrate 101, the n-type cladding layer 102, the active layer 103, the p-type cladding layer 104 and the p-type contact layer 105 are stacked in this order. A semiconductor laser device 301 comprises a sub-mount 110 and the semiconductor laser element 201.

In each of light emitting regions 190, a protruded portion 104a is formed in the p-type cladding layer 104 which is stacked on the active layer 103 serving as a light-emitting spot, and the protruded portion 104a constitutes, together with the contact layer 105a stacked thereon, a ridge portion. The surface of the semiconductor layers other than the surface of the p-type contact layer 105a, is covered with an insulating film 150 (150a, 150b). On the surface of the p-type contact layer 105a, there are formed an electrode 120 as an electrically-conductive layer in contact with the p-type contact layer 105a; and a first gold-plating layer 131 as an electrically-conductive layer which covers the electrode 120. The electrode 120 and the first gold-plating layer 131 extend into a non-light emitting region 191 which is separated from the light emitting region 190. In the semiconductor laser element 201, an isolation groove 151 whose bottom reaches the inside of the n-type cladding layer 102 is created between the light emitting regions 190, and thus, the electrode 120 has a configuration in which the light emitting regions 190 are isolated and electrically insulated from each other by means of the isolation groove 151 and the insulating film 150a.

The non-light emitting regions 191 are each established by covering a side portion of the light emitting region 190 with the insulating film 150b. In Embodiment 1, the non-light emitting region 191 has a structure similar to that of the semiconductor layers in the light emitting region 190, so that a planar portion 104b is formed in the p-type cladding layer 104 and a surface of the p-type contact layer 105b stacked on the planar portion 104b is covered with the insulating film 150b.

On a portion of the first gold-plating layer 131 which is placed over the planar portion in the non-light emitting region 191 and at a position nearer to the light emitting region 190, a second gold-plating layer 132 (132a, 132b) which is a convex part as a sidewall is formed to have a pattern of C-shape. Because of such a two-layer gold plating structure, the first gold-plating layer 131 and the second gold-plating layer 132 also as an electrically-conductive layer, are bonded through the solder 140, to an electrode 111 on the sub-mount 110.

Figure 4:
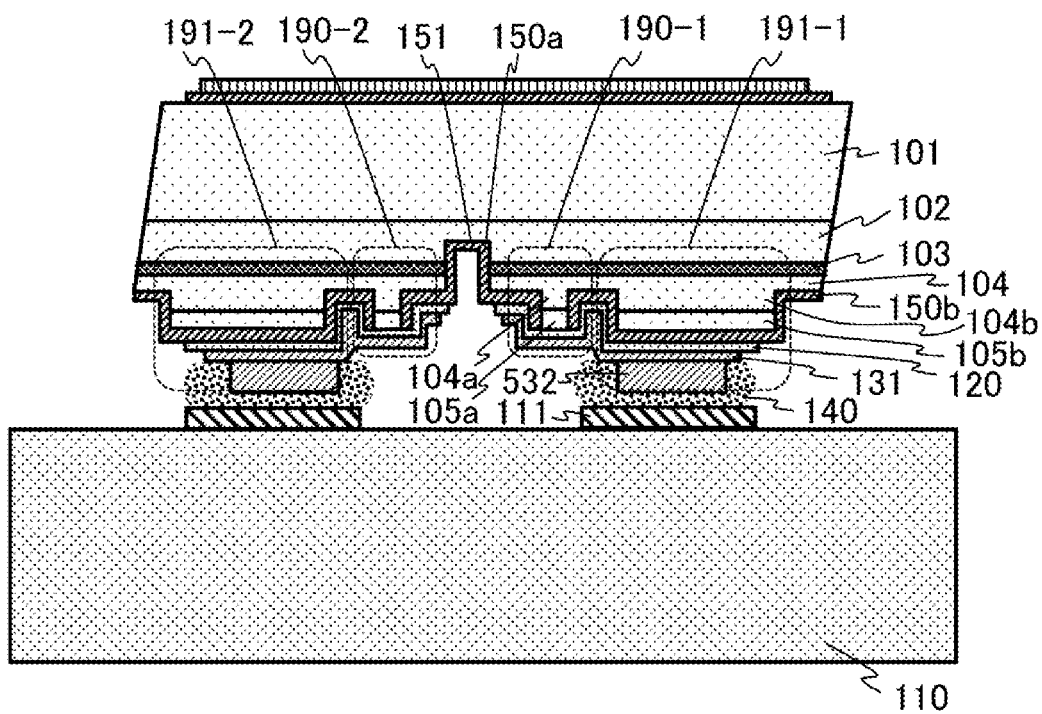
FIG. 4 is a sectional view showing a configuration of a conventional semiconductor laser element.

FIG. 4 is a sectional view showing a state after bonding of a conventional semiconductor laser element. As shown in FIG. 4, in the conventional semiconductor laser element, a second gold-plating layer 532 is provided widely on the first gold-plating layer 131 to thereby establish a clearance between the surface of the semiconductor laser element and the sub-mount 110. Thus, a structure is provided with which, at the time the semiconductor laser element is mounted on the sub-mount 110, it is difficult for the solder 140, even if it flows out to spread laterally, to make contact with a light emitting region 190-1 or 190-2 placed on the upper side. However, the conventional semiconductor laser element is not designed to retain the laterally-spread area of the solder 140 within the vicinity of a non-light emitting region 191-1. Thus, at the time of mounting on the sub-mount 110, if the solder 140 makes contact with the electrode, etc. connected to the adjacent light emitting region 190-2, to fall into an electrical short-circuit state, a problem arises in that the multiple light-emitting spots of the semiconductor laser element cannot be activated individually. As one of measures to prevent such electrical short-circuiting without enlarging the interval between the light emitting region 190-1 and the non-light emitting region 190-2 in the semiconductor laser element, such a method is assumed in which the width of the electrode 111 on the sub-mount is narrowed to thereby ensure a sufficient space for the lateral spreading of the solder 140; however, if the width of the electrode 111 on the sub-mount becomes narrower, highly-accurate position adjustment is required at the time the semiconductor laser element is mounted on the sub-mount 110, thus causing a new problem.

In Embodiment 1, at the time the semi-conductor laser element 201 is mounted on the sub-mount 110, bonding is performed using the second gold-plating layer 132 (132a, 132b) formed to have a pattern of C-shape in the non-light emitting region 191, in such a manner that the pattern surrounds the solder 140 on the electrode 111 of the sub-mount 110. This causes an intermediate portion 132a of the second gold-plating layer 132 in terms of the C-shape, to function as a barrier to prevent the solder 140 from flowing out to the light emitting region 190, and causes both end portions 132*b* of the second gold-plating layer 132 in terms of the C-shape, to function as barriers to prevent the solder 140 from flowing out to the end faces of the semiconductor laser element 201, so that it is possible to retain the spread area of the solder 140 in the central region of the second gold-plating layer 132 in terms of the C-shape, namely, within the non-light emitting region 191.

It is noted that, since the semiconductor laser element 201 and the sub-mount 110 are bonded together at the non-light emitting region 191, if the second gold-plating layer 132 (132*a*, 132*b*) is made thick, the stress caused thereby will not be applied or will be insensibly applied to the light emitting region 190, so that the light emitting characteristic of the semi-conductor laser element 201 is not impaired.

As described above, the semiconductor laser element 201 according to Embodiment 1 comprises:

- the semiconductor layers which are comprised of the n-type cladding layer 102 formed on a surface of the n-type GaAs substrate 101; the active layer 103 formed on a surface of the n-type cladding layer 102; the p-type cladding layer 104 formed on a surface of the active layer 103; and the p-type contact layer 105 formed on a surface of the p-type cladding layer 104; said p-type cladding layer and said p-type contact layer being formed to have a ridge portion 104*a*, 105*a*;
- the insulating film 150 (150*a*, 150*b*) which covers a surface of the semiconductor layers but has an opening on a surface of the p-type contact layer 105*a*; and
- the electrically-conductive layer (the electrode 120 and the first gold-plating layer 131), which is connected to the p-type contact layer 105*a* through the opening, said electrically-conductive layer being formed on a surface of the insulating film 150*b* so as to cover a planar portion which is provided in the semiconductor layers adjacently to the ridge portion;
- wherein, together with the electrically-conductive layer, a convex part (second gold-plating layer 132) serving as a sidewall is provided to be placed over a portion of the planar portion at its side nearer to the ridge portion.

Thus, the convex part as the sidewall can retain the spreading of the solder within the vicinity of the non-light emitting region to thereby prevent an inter-element electrical short circuit. In addition, since it can be formed easily, it is possible to reduce the manufacturing cost.

Figure 5:
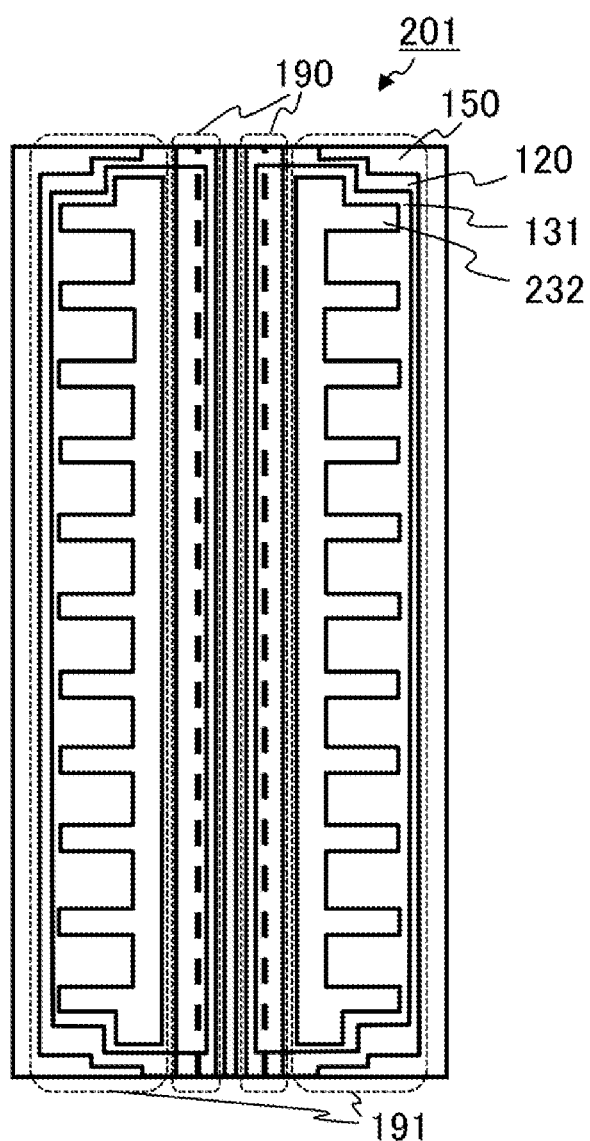
FIG. 5 is a plan view showing a configuration of another semiconductor laser element according to Embodiment 1, viewed from its side to be bonded.

It is noted that in Embodiment 1, although the convex part as the sidewall is given as the second gold-plating layer 132 having a C-shape, it is not limited thereto. For example, as shown in FIG. 5 which is a plan view showing a configuration of another semiconductor laser element according to Embodiment 1 viewed from its side to be bonded, the convex part as the sidewall may be a second gold-plating layer 232 having a comb shape. If this is the case, since the spread area of the solder is divided into small areas due to the comb shape, at the time of bonding the semiconductor element and the sub-mount together, it is possible not only to retain the spread area of the solder within the vicinity of the non-light emitting region, but also to prevent the solder from spreading unevenly. Further, since the contact area between the solder and the first and second gold-plating layers increases, reduced contact resistance and stable bonding can be expected.

Figure 6:
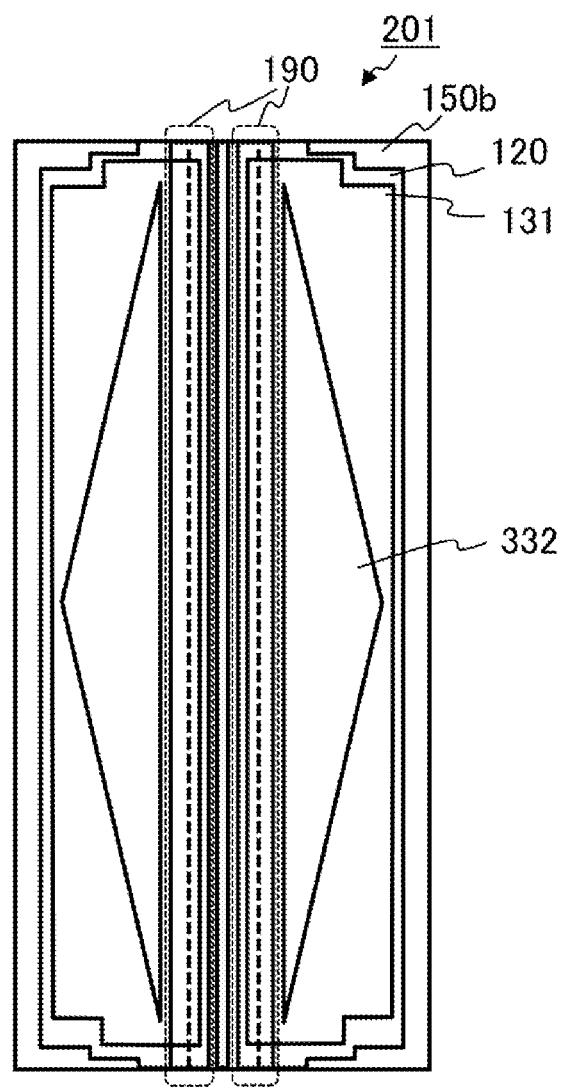
FIG. 6 a plan view showing a configuration of another semiconductor laser element according to Embodiment 1, viewed from its side to be bonded.
Figure 7:
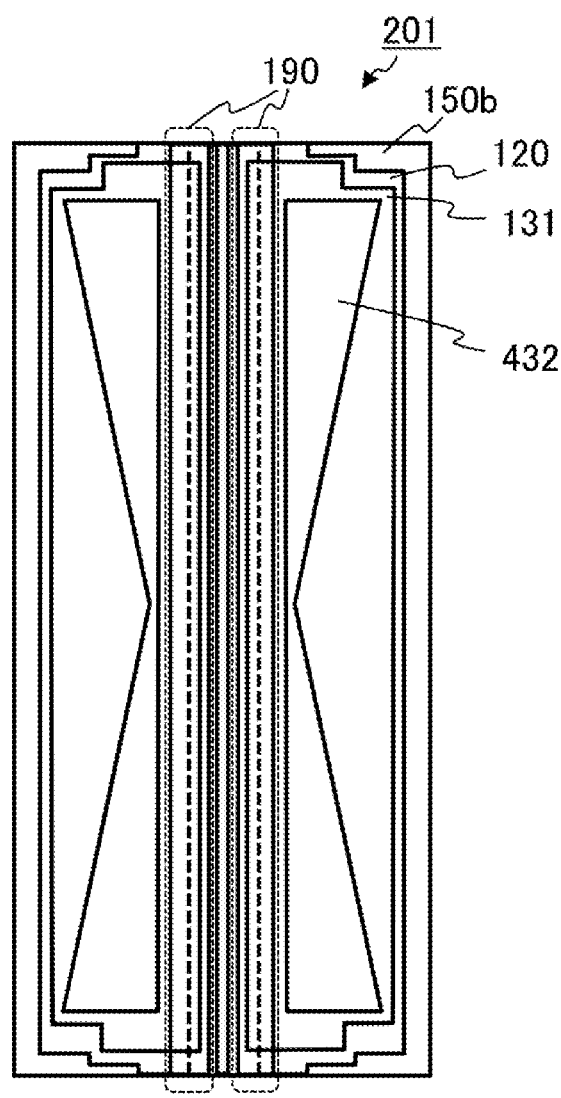
FIG. 7 a plan view showing a configuration of another semiconductor laser element according to Embodiment 1, viewed from its side to be bonded.

Instead, as shown in FIG. 6 and FIG. 7 which are each a plan view showing a configuration of another semiconductor laser element according to Embodiment 1 viewed from its side to be bonded and in which in the case of FIG. 6, the convex part as the sidewall is given as a second gold-plating layer 332 whose wall depth at its ends is thinner than that at its center, and in the case of FIG. 7, the convex part is given as a second gold-plating layer 432 whose wall depth at its center is thinner than that at its ends, it is allowed not only to retain the spread area of the solder within the vicinity of the non-light emitting region, but also to control the unevenly-placed position of the solder 140. At the time of mounting the semiconductor laser element 201 on the sub-mount 110, since the second gold-plating layer 432 serves as a barrier, the spreading solder 140 unevenly goes to an area where the wall depth of the second gold-plating layer 432 is thinner. In this manner, the wall depth of the second gold-plating layer 432 is varied so that the solder 140 may have unevenness in the resonator direction. This makes it possible to control a position on which a stress due to the solder 140 is concentrated. Further, since the contact area between the solder 140 and the first and second gold-plating layers 131, 432 increases, reduced contact resistance and stable bonding can be expected.

Embodiment 2

In Embodiment 1, the convex part as the sidewall is established as the shape of the second gold-plating layer 132, whereas in Embodiment 2, a case will be described where it is established as a shape of an underlying insulating film.

Figure 8:
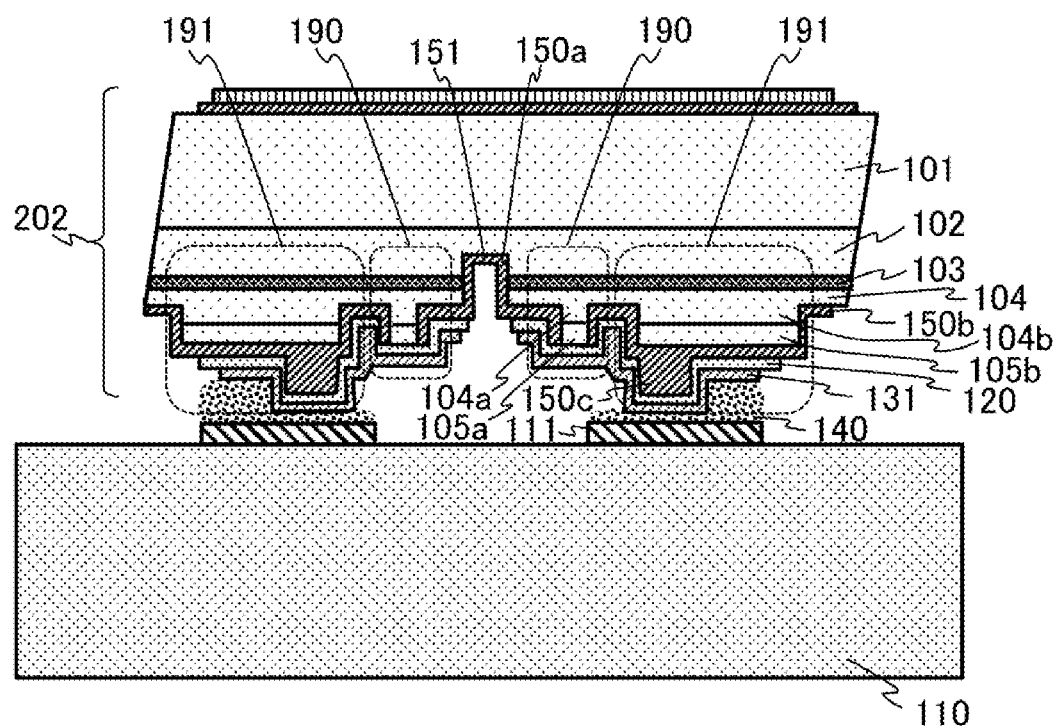
FIG. 8 is a sectional view showing a configuration of a semiconductor laser element according to Embodiment 2.

FIG. 8 is a sectional view showing a configuration of a semiconductor laser element 202 according to Embodiment 2, which shows a state after mounting. As shown in FIG. 8, in the semiconductor laser element 202 according to Embodiment 2, a convex part 150*c* is formed as an insulating film instead of the second gold-plating layer 132 in Embodiment 1, which is provided as a sidewall with a pattern of, for example, a C-shape, on an insulating film 150*b* at its side nearer to the light emitting region 190, said insulating film covering a planar portion of a p-type contact layer 105*b* as a semiconductor layer in the non-light emitting region 191. The convex part 150*c* formed as an insulating film is covered with the electrode 120 in such a manner that the electrode covers a region from the surface of the p-type contact layer 105*a* to a portion of the insulating film 150*b* placed on the planar portion of the p-type contact layer 105*b* in the non-light emitting region 191. Furthermore, the electrode 120 is covered with the first gold-plating layer 131. Other than the above, the configuration of the semiconductor laser element 202 according to Embodiment 2 is similar to that of the semiconductor laser element 201 in Embodiment 1, so that, for the equivalent parts, the same reference numbers are given and description thereof will be omitted.

In Embodiment 2, at the time the semi-conductor laser element 202 is mounted on the sub-mount 110, bonding is performed using the convex part 150*c* as an insulating film formed to have a pattern of C-shape in the non-light emitting region 191, in such a manner that the pattern surrounds the solder 140 on the electrode 111 of the sub-mount 110. This causes the convex part 150*c* to function as a barrier to prevent the solder 140 from flowing out to the light emitting region 190 and to an end face of the semiconductor laser element 202 on its light-emitting part side, so that it is possible to retain the spread area of the solder 140 in the central region of the convex part 150*c* in terms of the C-shape, namely, within the non-light emitting region 191.

It is noted that the semiconductor laser element 202 and the electrode 111 of the sub-mount 110 are desired to be bonded together using the solder 140 after the solder 140 is placed on the electrode 111 of the sub-mount 110 so as to be positioned outwardly from the convex part 150*c* as an insulating film (namely, the convex part 150c as an insulating film is positioned on a side against the flowing out of the solder 140).

As described above, according to the semiconductor laser element 202 in accordance with Embodiment 2, the convex part 150c formed as an insulating film is provided on the insulating film 150b covering the planar portion in the non-light emitting region 191, and at the side of that insulating film nearer to the light emitting region 190, and then it is covered with the electrode 120 and the first gold-plating layer 131. Thus, the convex part as the sidewall can retain the spreading of the solder within the vicinity of the non-light emitting region to thereby prevent an inter-element electrical short circuit. In addition, since it can be formed easily, it is possible to reduce the manufacturing cost.

Embodiment 3

In Embodiment 2, the convex part as the sidewall is formed as an insulating film, whereas in Embodiment 3, a case will be described where it is formed as a part of the semiconductor layers.

Figure 9:
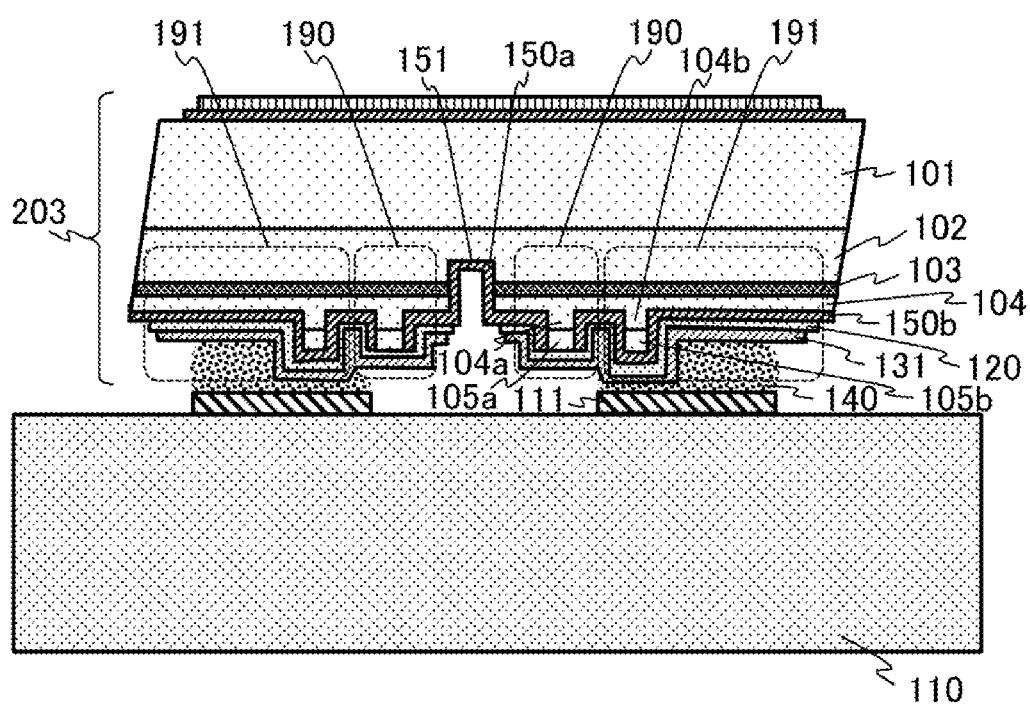
FIG. 9 is a sectional view showing a configuration of a semiconductor laser element according to Embodiment 3.

FIG. 9 is a sectional view showing a configuration of a semiconductor laser element 203 according to Embodiment 3, which shows a state after mounting. As shown in FIG. 9, in the semiconductor laser element 203 of Embodiment 3, instead of the second gold-plating layer 132 in Embodiment 1 and the convex part 150c as an insulating film in Embodiment 2, a convex part 104b, 105b as a part of the semiconductor layers, is formed as a sidewall with a pattern of, for example, a C-shape, at the side nearer to the light emitting region 190, and thus the p-type cladding layer 104 as the semiconductor layer is partly dug out so that a planar portion thereof is formed at its side nearer to the edge thereof. Except for the surface of the p-type contact layer 105a, the surface of the semiconductor layers, as well as the surface of the convex part 104b, 105b, is covered with the insulating film 150 (150a, 150b). The convex part 104a, 105b formed as a part of the semiconductor layers is covered with the electrode 120 in such a manner that the electrode covers a region from the surface of the p-type contact layer 105a to the edge of the planar portion in the p-type cladding layer 104. Furthermore, the electrode 120 is covered with the first gold-plating layer 131. Other than the above, the configuration of the semiconductor laser element 203 according to Embodiment 3 is similar to that of the semiconductor laser element 201 in Embodiment 1, so that, for the equivalent parts, the same reference numbers are given and description thereof will be omitted.

In Embodiment 3, at the time the semi-conductor laser element 203 is mounted on the sub-mount 110, bonding is performed using the convex part 104b, 105b as a part of the semiconductor layers which is formed to have a pattern of C-shape in the non-light emitting region 191, in such a manner that the pattern surrounds the solder 140 on the sub-mount 110. This causes the convex part 104b, 105b to function as a barrier to prevent the solder 140 from flowing out to the light emitting region 190 and to an end face of the semiconductor laser element 203 on its light-emitting part side, so that it is possible to retain the spread area of the solder 140 in the central region of the convex part 104b, 105b in terms of the C-shape, namely, within the non-light emitting region 191.

It is noted that the semiconductor laser element 203 and the sub-mount 110 are desired to be bonded together using the solder 140 after the solder 140 is placed on the electrode 111 of the sub-mount 110 so as to be positioned outwardly from the convex part 104b, 105b as a part of the semiconductor layers (namely, the convex part 104b, 105b as a part of the semi-conductor layers is positioned on a side against the flowing out of the solder 140).

As described above, according to the semiconductor laser element 203 in accordance with Embodiment 3, the convex part 104b, 105b formed as a part of the semiconductor layers is provided at the side nearer to the light emitting region 190, and is covered with the insulating film 150b, the electrode 120 and the first gold-plating layer 131. Thus, the convex part as the sidewall can retain the spreading of the solder within the vicinity of the non-light emitting region to thereby prevent an inter-element electrical short circuit. In addition, since it can be formed easily, it is possible to reduce the manufacturing cost.

Embodiment 4

In Embodiment 4, the manufacturing method will be described in which the first gold-plating layer 131 and the second gold-plating layer 132 in Embodiment 1 are formed by a single plating step.

Figure 10:
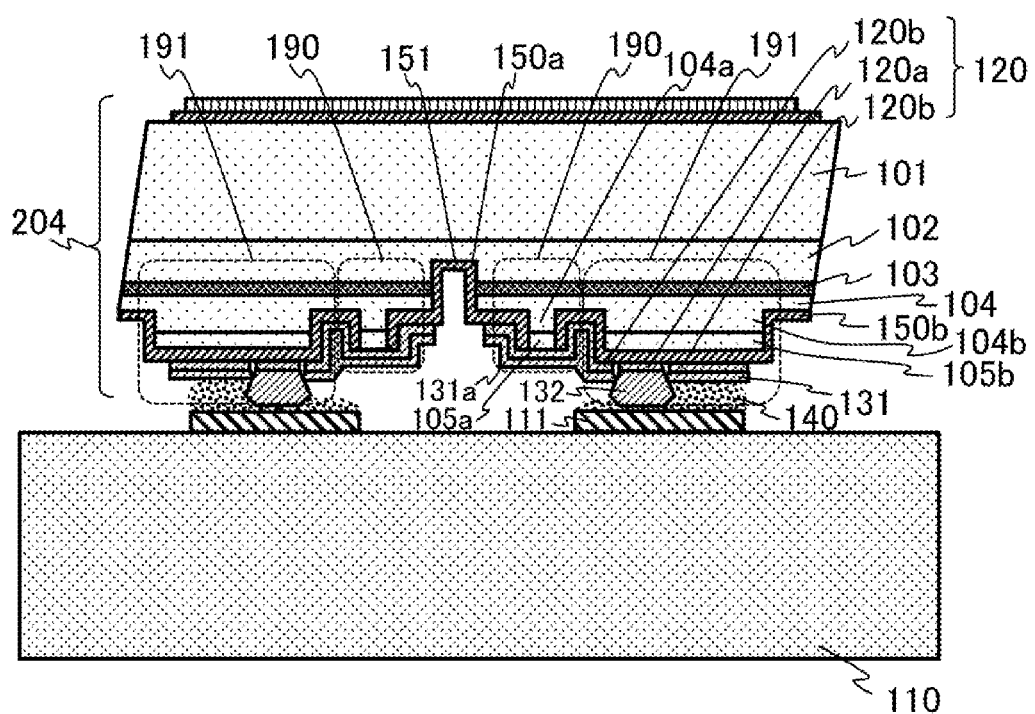
FIG. 10 is a sectional view for explaining a manufacturing method of a semiconductor laser element according to Embodiment 4.
Figure 11:
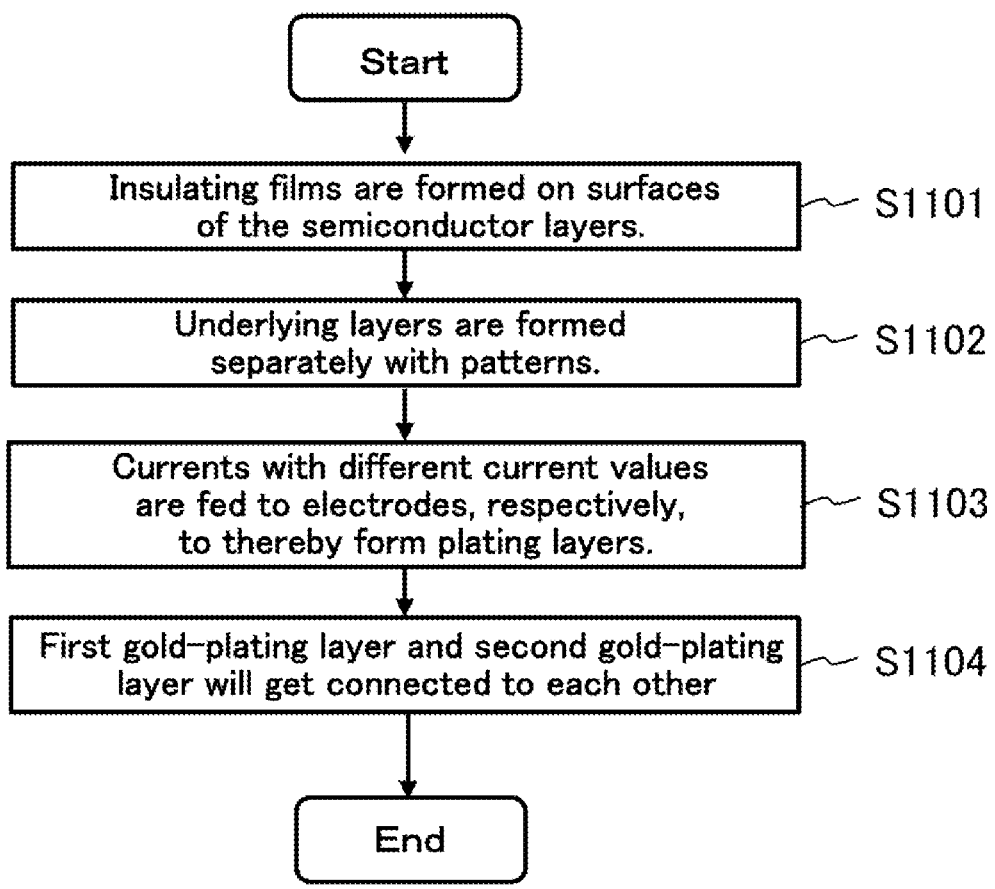
FIG. 11 is a flowchart showing steps in the manufacturing method of the semiconductor laser element according to Embodiment 4.

FIG. 10 is a sectional view for explaining the manufacturing method of a semiconductor laser element 204 according to Embodiment 4, which shows a state after mounting. FIG. 11 is a flowchart showing how the plating step for the semiconductor laser element 204 according to Embodiment 4 is performed.

First of all, the insulating film 150 (150a, 150b) is formed on the semiconductor layers which are comprised of the n-type cladding layer 102 formed on a surface of the n-type GaAs substrate 101; the active layer 103 formed on a surface of the n-type cladding layer 102; the p-type cladding layer 104 formed on a surface of the active layer 103; and the p-type contact layer 105a formed on a surface of the p-type cladding layer 104 (Step S1101), said p-type cladding layer and said p-type contact layer being formed to have the ridge portion 104a, 105a, and said insulating film covering the surface of the semiconductor layers but having an opening on a surface of the p-type contact layer 105a.

Subsequently, as shown in FIG. 10, on the p-type contact layer 105a and the insulating film 150 (150a, 150b), the electrode 120 as an underlying layer is formed separately as an electrode 120a that is a first underlying electrode and an electrode 120b that is a second underlying electrode (Step S1102), said first underlying electrode being located over the planar portion provided in the semiconductor layers adjacently to the ridge portion 104a, 105a, at a position nearer to the ridge portion 104a, 105a, and being provided as an electrode on which the second gold-plating layer 132 with a pattern of, for example, a C-shape, is to be stacked; and said second underlying electrode being connected to the p-type contact layer 105a through the opening, surrounding the electrode 120a, and covering a surface of the insulating film 150b under which the planar portion provided in the semiconductor layers adjacently to the ridge portion 104a, 105a, is covered.

Then, currents with different current values are fed to the separately-formed electrode 120a and electrode 120b, respectively, to thereby form the second gold-plating layer 132 and the first gold-plating layer 131 at the same time (Step S1103). In order to form the second gold-plating layer 132 to be thicker than the first gold-plating layer 131, the current value of the current fed to the electrode 120a is set larger than that fed to the electrode 120b. Note that, on this occasion, the first gold-plating layer 131 and the second gold-plating layer 132 grow not only in the thickness direction but also in the lateral direction.

Since the first gold-plating layer 131 and the second gold-plating layer 132 grow also in the lateral direction, the first gold-plating layer 131 and the second gold-plating layer 132 will get connected to each other to become mutually conductive (Step S1104), and thereafter, these layers will reach their respective prescribed thicknesses, lastly.

As described above, the manufacturing method of a semiconductor laser element according to Embodiment 4 comprises:

a step of forming the insulating film 150 (150a, 150b) covering a surface of semiconductor layers which are comprised of the n-type cladding layer 102 formed on a surface of the n-type GaAs substrate 101; the active layer 103 formed on a surface of the n-type cladding layer 102; the p-type cladding layer 104 formed on a surface of the active layer 103; and the p-type contact layer 105a formed on a surface of the p-type cladding layer 104; said p-type cladding layer and said p-type contact layer being formed to have the ridge portion 104a, 105b, and said insulating film having an opening on a surface of the p-type contact layer 105a;

a step of forming the underlying electrode 120 separately as the electrode 120a and the electrode 120b, respectively, on the insulating film 150b and on the p-type contact layer 105a and the insulating film 150b, said electrode 120a being located over the planar portion provided in the semiconductor layers adjacently to the ridge portion 104a, 105a, at a position nearer to the ridge portion 104a, 105a, and being provided as an electrode on which the second gold-plating layer 132 with a pattern of, for example, a C-shape, is to be stacked; and said electrode 120b being connected to the p-type contact layer 105a through the opening, surrounding the electrode 120a, and covering a surface of the insulating film 150b under which the planar portion provided in the semiconductor layers adjacently to the ridge portion 104a, 105a, is covered; and a step of plating these electrodes in such a manner that a current value of a current fed to the electrode 120a is set larger than a current value of a current fed to the electrode 120b.

Thus, the first gold-plating layer 131 and the second plating layer can be formed easily, so that, not only the convex part as the sidewall can retain the spreading of the solder within the vicinity of the non-light emitting region to thereby prevent an inter-element electrical short circuit, but also the manufacturing cost can be reduced.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the description of this application. For example, such cases shall be included where at least one configuration element is modified; where at least one configuration element is added or omitted; and furthermore, where at least one configuration element is extracted and combined with a configuration element of another embodiment.

DESCRIPTION OF REFERENCE NUMERALS AND SIGNS

102: n-type cladding layer (first cladding layer), 103: active layer, 104: p-type cladding layer (second cladding layer), 104a: p-type cladding layer (ridge portion), 105: p-type contact layer, 105a: p-type contact layer (ridge portion), 120: electrode, 120a: electrode, 131: first gold-plating layer, 132: second gold-plating layer, 150, 150a, 150b: insulating film, 201, 202, 203: semiconductor laser element, 301: semiconductor laser device.

The invention claimed is:

1. A semiconductor laser element which is bonded to a sub-mount in a junction-down manner, comprising:
   semiconductor layers which are comprised of a first cladding layer formed on a surface of a semiconductor substrate; an active layer formed on a surface of the first cladding layer; a second cladding layer formed on a surface of the active layer; and a contact layer formed on a surface of the second cladding layer; said second cladding layer and said contact layer being formed to have a ridge portion;
   an insulating film which covers a surface of the semiconductor layers but has an opening on a surface of the contact layer;
   an electrically-conductive layer which is connected to the contact layer through the opening, said electrically-conductive layer being formed on a surface of the insulating film so as to cover a planar portion which is provided in the semiconductor layers adjacently to the ridge portion, the planar portion having a first side and a second side opposite to the first side, a first distance from the ridge portion to the first side being less than a second distance from the ridge portion to the second side; and
   a convex part as a sidewall, which is formed over a portion of the planar portion at the first side, so as to surround a solder;
   wherein the convex part is configured to retain a spread area of the solder within a non-light emitting region; and
   wherein the convex part and the planar portion are bonded to an electrode on the sub-mount through the solder.

2. The semiconductor laser element of claim 1, wherein the convex part is formed into a C-shape.

3. The semiconductor laser element of claim 1, wherein the convex part is formed into a comb shape.

4. The semiconductor laser element of claim 1, wherein a wall depth of the convex part is varied when viewed from a plan view direction.

5. The semiconductor laser element of claim 1, wherein the convex part is formed as a part of the electrically-conductive layer.

6. The semiconductor laser element of claim 1, wherein the convex part is formed as a part of the insulating film and its surface is covered with the electrically-conductive layer.

7. The semiconductor laser element of claim 1, wherein the convex part is formed as a part of the semiconductor layers and is covered with the insulating film and the electrically-conductive layer.

8. A manufacturing method of a semiconductor laser element, comprising:
   a step of forming an insulating film covering a surface of semiconductor layers which are comprised of a first cladding layer formed on a surface of a semiconductor substrate; an active layer formed on a surface of the first cladding layer; a second cladding layer formed on a surface of the active layer; and a contact layer formed on a surface of the second cladding layer; said second cladding layer and said contact layer being formed to have a ridge portion, and said insulating film having an opening on a surface of the contact layer;

a step of forming an underlying electrode separately as a first underlying electrode and a second underlying electrode, respectively, on a surface of the insulating film and on surfaces of the contact layer and the insulating film; said first underlying electrode having a plan view shape corresponding to a sidewall which is provided over a planar portion provided in the semiconductor layers adjacently to the ridge portion, at a first side of the planar portion; and said second underlying electrode being connected to the contact layer through the opening, surrounding the first underlying electrode, and covering a surface of the insulating film under which the planar portion is covered; and a step of plating the first underlying electrode and the second underlying electrode in such a manner that a current value of a current fed to the first underlying electrode is set larger than a current value of a current fed to the second underlying electrode, wherein the planar portion includes the first side and a second side opposite to the first side, a first distance from the ridge portion to the first side being less than a second distance from the ridge portion to the second side.

9. A semiconductor laser device in which the semiconductor laser element of claim 1 is bonded to an electrode provided on a surface of a sub-mount, through a solder and by way of a portion of the electrically-conductive layer corresponding to the planar portion in the semiconductor laser element and an electrically-conductive layer as a wall surface of the sidewall placed on its side opposite to the ridge portion-side.

10. A semiconductor laser device in which the semiconductor laser element of claim 2 is bonded to an electrode provided on a surface of a sub-mount, through a solder and by way of a portion of the electrically-conductive layer corresponding to the planar portion in the semiconductor laser element and an electrically-conductive layer as a wall surface of the sidewall placed on its side opposite to the ridge portion-side.

11. A semiconductor laser device in which the semiconductor laser element of claim 3 is bonded to an electrode provided on a surface of a sub-mount, through a solder and by way of a portion of the electrically-conductive layer corresponding to the planar portion in the semiconductor laser element and an electrically-conductive layer as a wall surface of the sidewall placed on its side opposite to the ridge portion-side.

12. A semiconductor laser device in which the semiconductor laser element of claim 4 is bonded to an electrode provided on a surface of a sub-mount, through a solder and by way of a portion of the electrically-conductive layer corresponding to the planar portion in the semiconductor laser element and an electrically-conductive layer as a wall surface of the sidewall placed on its side opposite to the ridge portion-side.

13. A semiconductor laser device in which the semiconductor laser element of claim 5 is bonded to an electrode provided on a surface of a sub-mount, through a solder and by way of a portion of the electrically-conductive layer corresponding to the planar portion in the semiconductor laser element and an electrically-conductive layer as a wall surface of the sidewall placed on its side opposite to the ridge portion-side.

14. A semiconductor laser device in which the semiconductor laser element of claim 6 is bonded to an electrode provided on a surface of a sub-mount, through a solder and by way of a portion of the electrically-conductive layer corresponding to the planar portion in the semiconductor laser element and an electrically-conductive layer as a wall surface of the sidewall placed on its side opposite to the ridge portion-side.

15. A semiconductor laser device in which the semiconductor laser element of claim 7 is bonded to an electrode provided on a surface of a sub-mount, through a solder and by way of a portion of the electrically-conductive layer corresponding to the planar portion in the semiconductor laser element and an electrically-conductive layer as a wall surface of the sidewall placed on its side opposite to the ridge portion-side.

* * * * *